United States Patent
Kuwabara

[19]

[11] Patent Number: 5,900,751
[45] Date of Patent: May 4, 1999

[54] AUTOMATIC FREQUENCY CONTROL CIRCUIT WITH SIMPLIFIED CIRCUIT CONSTITUTION

[75] Inventor: Keiichi Kuwabara, Tokyo, Japan

[73] Assignee: NEC Corporation, Tokyo, Japan

[21] Appl. No.: 08/984,821

[22] Filed: Dec. 4, 1997

[30] Foreign Application Priority Data

Dec. 5, 1996 [JP] Japan ................................. 8-324925

[51] Int. Cl.⁶ .................................................. H03B 19/00
[52] U.S. Cl. ........................................... 327/113; 327/141
[58] Field of Search ........................ 327/113, 114, 327/115, 116, 118, 119, 141, 144, 155, 356, 360, 361

[56] References Cited

FOREIGN PATENT DOCUMENTS 2-260912  10/1990  Japan .

*Primary Examiner*—Timothy P. Callahan
*Assistant Examiner*—Jeffrey Zweizig
*Attorney, Agent, or Firm*—Scully, Scott, Murphy & Presser

[57] ABSTRACT

In an automatic frequency control circuit, a circuit constitution thereof is simplified without decreasing performance of demodulation. In the control circuit, a frequency counter counts a number of regenerative intermediate frequency from an intermediate frequency or a wave detection circuit, then a magnitude comparator compares an output of the frequency counter with a prescribed comparison data, before a subtraction circuit subtracts the output of the frequency counter from the prescribed comparison data. An operation part implements required operation according to an output of the magnitude comparator and an output of the subtraction circuit. A D/A converter converts an output data of the operation part into an analog signal. A TCXO oscillates an oscillation frequency according to the analog signal of the D/A converter. A variable frequency demultiplier is connected to a stage in front of the frequency counter. Due to this constitution, it is capable of compensating a frequency deviation of the TCXO without in use of a divider.

6 Claims, 3 Drawing Sheets

AUTOMATIC FREQUENCY CONTROL CIRCUIT WITH SIMPLIFIED CIRCUIT CONSTITUTION

BACKGROUND OF THE INVENTION

The present invention relates to an automatic frequency control circuit in use for digital communication apparatus. More to particularly this invention relates to an automatic frequency control circuit which eliminates frequency deviation (drift) to improve demodulation performance using simplified circuit constitution without large sized complicated means such as a divider.

DESCRIPTION OF THE RELATED ART

Formerly, the frequency automatic control circuit is generally in use for a field of mobile communication. In this field of the mobile communication, it is important to be capable of being realized how accurate demodulation the mobile communication needs. In general, superheterodyne system is in use for a receiver, and a local oscillator is in use to implement frequency conversion from a reception frequency to an intermediate frequency. The local oscillator is composed of for example, a reference oscillator such as TCXO or the like, in which oscillation frequency is changed in accordance with voltage, and a synthesizer which is the means for converting the oscillation frequency into the intermediate frequency. Here, when frequency deviation is included into the oscillation frequency of the local oscillator, the intermediate frequency of the receiver is shifted from the prescribed value, thus the oscillation frequency is incapable of being demodulated accurately. Consequently, it is necessary to compensate deviation of the oscillation frequency of the local oscillator for stabilizing the intermediate frequency while following the receiving frequency. For this reason, in the mobile communication device, an automatic frequency control circuit (AFC circuit) is in use as a circuit for compensating deviation of the oscillation frequency of the local oscillator.

FIG. 1 is a constitution view showing double superheterodyne receiver in use for mobile communication as a conventional example. In this conventional example, a reception output of a receiving antenna 1 is converted into a signal of a first intermediate frequency FIF1 in a first mixer 2, before being converted into a signal of a second intermediate frequency FIF2 in a second mixer 3. Further the converted signal is amplified by a amplifier 4 to prescribed level, before being subjected to a pulse code discrimination by a pulse code discrimination circuit 5, thus a demodulated output is acquired.

A signal of a first local oscillation frequency FL1 is applied to the first mixer 2 to convert the receiving frequency FR into the first intermediate frequency FIF1. A signal of a second local oscillation frequency FL2 is applied to the second mixer 3 to convert the first intermediate frequency FIF1 into the second intermediate frequency FL2. The first local oscillation frequency FL1 of these local oscillation frequencies is generated by phase-locked loop (PLL) synthesizer 8 based on an output of the TCXO (described after). The second local oscillation frequency FL2 thereof is generated by an M-multiplexing circuit 7 based on an output of the TCXO (described after). The first local oscillation frequency FL1, and the second local oscillation frequency FL2 are dictated respectively by next expression (1) when a local frequency is higher than the intermediate frequency.

$$FIF1 = FL1 - FR$$

$$FIF2 = FL2 - FIF1 \tag{1}$$

Further, in the circuit shown in FIG. 1, the phase-locked loop synthesizer 12 as a constitution concerning transmission incorporates signal to be transmitted from a digital input terminal 23 to demodulate. The signal to be transmitted is amplified by an amplifier 10 to be transmitted from a transmitting antenna 9. Here, if an output frequency (intermediate frequency of transmission) of the phase-locked loop synthesizer 12 is FIFT, a transmission frequency FT is dictated as a next expression (2).

$$FT = FL1 - FIFT \tag{2}$$

A reference frequency of the oscillation in the phase-locked loop synthesizer 12 is supplied by a temperature compensated crystal oscillator TCXO which is the same way as that of the phase-locked loop synthesizer 8, as described above, following the reception frequency FR. Also it is necessary to stabilize the transmission frequency FT at the prescribed position. For this reason, in the conventional example, an automatic frequency control circuit (AFC circuit) 42 is provided in order to supply signal of prescribed frequency F0 for the phase-locked loop synthesizer 8, M-multiplexing circuit 7, and the phase-locked loop synthesizer 12 while ensuring signal deviation.

Namely, the phase-locked loop synthesizers 8 and 12 generate a signal of the local oscillation frequency FL1 or a signal of the intermediate frequency FIFT with a signal from the AFC circuit 42 (in detail, from the TCXO involved in the circuit) as reference. The M-multiplexing circuit 7 generates a signal of the local oscillation frequency FL2=M·F0. At this time, in cases where the deviation is incorporated in the prescribed frequency F0, for example, with deviation factor as α, when the prescribed frequency is dictated as F0(1+α), influence of the deviation emerges in terms of respective frequencies FL1, FL2, and FIFT. Namely, the first local oscillation frequency comes to be FL1(1+α). The second local oscillation frequency comes to be FL2(1+α). The intermediate frequency comes to be FIFT(1+α). The influence also emerges in terms of the intermediate frequencies FIF1 and FIF2 as a matter of course. If it causes the intermediate frequencies FIF1 and FIF2 including deviation to be dictated as fif1 and fif2 respectively, thus effecting after expression (3):

$$\begin{aligned}fif1 &= FL1(1+\alpha) - FR \\ fif2 &= FL2(1+\alpha) - fif1 \\ &= FL2(1+\alpha) - FL1(1+\alpha) + FR \\ &= \alpha(FL2 - FL1) + FL2 - FL1 + FR\end{aligned} \tag{3}$$

When it substitutes the below described expression (4) for the expression (3), there is dictated as expression (5).

$$\begin{aligned}FIF1 &= FL1 - FR \\ FIF2 &= FL2 - FIF1 \\ &= FL2 - FL1 + FR\end{aligned} \tag{4}$$

$$fif2 = \alpha(FL2 - FL1) + FIF2 \tag{5}$$

Consequently, when true intermediate frequency FIF2, and a reception frequency (reception channel) FR are already known, if the intermediate frequency fif2 acquired due to the second mixer 3 is known, the deviation of oscillation frequency in the automatic frequency control circuit (AFC circuit) 42 is found. The automatic frequency control circuit (AFC circuit) 42 has a function that it causes the intermediate frequency fif2 to be determined to compare the true intermediate frequency FIF2 therewith, thus controlling the oscillation frequency such that the deviation α·F0 vanishes. The AFC circuit 42 is capable of realizing this function by virtue of the following constitution. In the AFC circuit 42, an output of the amplifier 4 including frequency deviation with the reception frequency as FR, with true intermediate frequency as FIF2, with the deviation factor as α, and with the intermediate frequency including deviation as fif2, is capable of dictating as expression (5) described above.

$$fif2=\alpha(FIF2-FR)+FIF2 \qquad (5)$$

An output of a counter 14 which output is inputted to a magnitude comparator 15 is compared with the data of true intermediate frequency of a ROM 21, then there is judged whether frequency deviation of the intermediate frequency is higher frequency than the true intermediate frequency or frequency deviation of the intermediate frequency is lower frequency than the true intermediate frequency. Further, the output of the counter 14 is also inputted to a subtraction circuit 17, thus data, $|FIF2-fif2|$ are obtained.

Here, it is important and well known that the deviation factor α is capable of being dictated as γ·β [ppm/bit] due to the relationship of the modulation sensitivity of the temperature compensated crystal oscillator and the output resolution of the digital-to-analog converter D/A, with modulation sensitivity of the temperature compensated crystal oscillator TCXO as β [ppm/V], and with an output resolution of a digital-to-analog converter D/A as γ [V/bit].

As described above the intermediate frequency fif2 including deviation is capable of being dictated as above described the expression (5) using the reception frequency FR, the true intermediate frequency FIF2, and the deviation factor α. Namely $fif2=\alpha(FIF2-FR)+FIF2$.

Consequently, according to the above-described expression the frequency deviation of the intermediate frequency comes into the following expression (6).

$$|FIF2-fif2|=|-\alpha(FIF2-FR)| \qquad (6)$$

When it causes $\alpha=\gamma\cdot\beta$ to substitute for the above expression (6) to come to be the following expression (7).

$$|FIF2-fif2|=|-\gamma\cdot\beta(FIF2-FR)| \qquad (7)$$

When it puts the above matters in order, following effects are obtained.

The frequency deviation of the intermediate frequency to be searched:

$$|-\alpha(FIF2-FR)|[Hz]$$

Rate of change of the intermediate frequency toward an input of digital-to-analog converter:

$$|-\gamma\cdot\beta(FIF2-FR)|[Hz/bit]$$

Consequently, the following expression (8) is obtained.

$$N=|-\gamma\cdot\beta(FIF2-FR)| \qquad (8)$$

Since a divider 25 causes an output data of the subtraction circuit 17 to be 1/N, data of the following expression (9) is obtained.

$$|FIF2-fif2|/N$$
$$=|-\alpha(FIF2-FR)|/|-\gamma\cdot\beta(FIF2-FR)| \qquad (9)$$

The operating part 20 calculates data to be outputted to the D/A converter 19 according to the output result both of the magnitude comparator 15 and the subtraction circuit 17. The D/A converter 19 converts data from the operating part 20 into an analog voltage to control the TCXO 16, with the result that an oscillation frequency of the TCXO 16 comes to be a stable frequency without deviation. As described above, in the conventional method, a frequency error is calculated. It causes the frequency error to divide by a value calculated according to modulation sensitivity of the TCXO and the output resolution of the D/A converter. The TCXO is controlled in answer to the value obtained via above calculation. Thereby the TCXO is controlled in such a way that the deviation α·F0 of the oscillation frequency of the TCXO comes to be 0, thus following the reception frequency FR certainly. Further, a transmission frequency FT certainly follows the reception frequency FR (in case of mobile communication, corresponding to transmission frequency to a base station).

As another conventional example with technology similar to the present invention, Japanese Patent Application Laid-Open No. HEI 2-260912 discloses AUTOMATIC FREQUENCY CONTROL METHOD AND CIRCUIT USING THE SAME in which a processing unit is used.

However, according to the circuit constitution described above as the conventional example, a divider and so forth should be involved therein, thereby there is a problem that the circuit constitution is complicated and the circuit size becomes large.

SUMMARY OF THE INVENTION

In view of the foregoing, it is an object of the present invention to provide an automatic frequency control circuit in which a circuit constitution is simplified although performance of demodulation is maintained.

In accordance with one aspect of the present invention, for achieving the above-mentioned object, there is provided an automatic frequency control circuit which comprises a frequency counter for counting either an intermediate frequency or a regenerative intermediate frequency based on a signal from a wave detection circuit, a magnitude comparator for comparing an output of the frequency counter with a prescribed comparison data obtained in such a way that it causes a true intermediate frequency of a ROM to be divided by a factor of N, and then, there is judged whether a frequency deviation of the intermediate frequency is higher frequency than a true intermediate frequency or the frequency deviation of the intermediate frequency is lower frequency than the true intermediate frequency, a subtraction circuit for subtracting the output of the frequency counter from the prescribed comparison data, an operation part for implementing prescribed operation according both to an output of the magnitude comparator and an output of the subtraction circuit such that the data to be outputted to a D/A converter is calculated in accordance with the result of output of the magnitude comparator and the subtraction circuit, a D/A (digital-to-analog) converter for converting an output of the operation part into an analog signal, a TCXO (temperature compensated crystal oscillator) for oscillating an oscillation frequency according to the analog signal of the D/A converter, and a variable frequency demultiplier connected to a stage in front of the frequency counter, wherein the D/A converter converts data from the operation part into an analog voltage to control the TCXO.

Preferably, in an automatic frequency control circuit, a number of frequency division of the variable frequency demultiplier and the prescribed comparison data are selected according to modulation sensitivity of the TCXO, output resolution of the D/A converter, reception frequency, and a true intermediate frequency.

Preferably, in an automatic frequency control circuit, the prescribed comparison data is stored in a storage unit such as a ROM, a resistor circuit and so forth.

Preferably, in an automatic frequency control circuit, the storage unit is temporary storage type and is capable of rewriting, thus it is capable of changing the prescribed comparison data at any time.

Preferably, in an automatic frequency control circuit, the selected number of frequency division of the variable frequency demultiplier and the comparison data are provided by said storage unit.

In accordance with another aspect of the invention, there is provided a frequency deviation eliminating method of an automatic frequency control circuit comprising the steps of a frequency counting step for counting either an intermediate frequency or a regenerative intermediate frequency from a wave detection circuit, a magnitude comparison step for comparing an output of the frequency counter with a prescribed comparison data obtained in such a way that it causes a true intermediate frequency of a ROM to be divided by a factor of N, namely, there is judged whether a frequency deviation of the intermediate frequency is higher frequency than a true intermediate frequency or the frequency deviation of the intermediate frequency is lower frequency than a true intermediate frequency, a subtraction step for subtracting between the output of the frequency counter and the prescribed comparison data, an operation step for implementing prescribed operation according both to an output of the magnitude comparator and an output of the subtraction circuit such that the data to be outputted to a D/A converter is calculated in accordance with the result of output of the magnitude comparator and the subtraction circuit, a D/A (digital-to-analog) converting step for converting an output of the operation part into an analog signal, an oscillating step (by a temperature compensated crystal oscillator) for oscillating an oscillation frequency according to the analog signal of the D/A converter, and a variable frequency demultiplying step for dividing an output of an amplifier by a factor of N before the frequency counting step, wherein the D/A converting step converts data from the operating step into an analog voltage to control the oscillating step, thus an oscillation frequency from the oscillating step becomes stable oscillation frequency without deviation.

The above and further objects and novel features of the invention will be more fully understood from the following detailed description when the same is read in connection with the accompanying drawings. It should be expressly understood, however, that the drawings are for purpose of illustration only and are not intended as a definition of the limits of the invention.

DETAILED DESCRIPTION OF THE PREFERRED EMBODIMENTS

Figure 1:
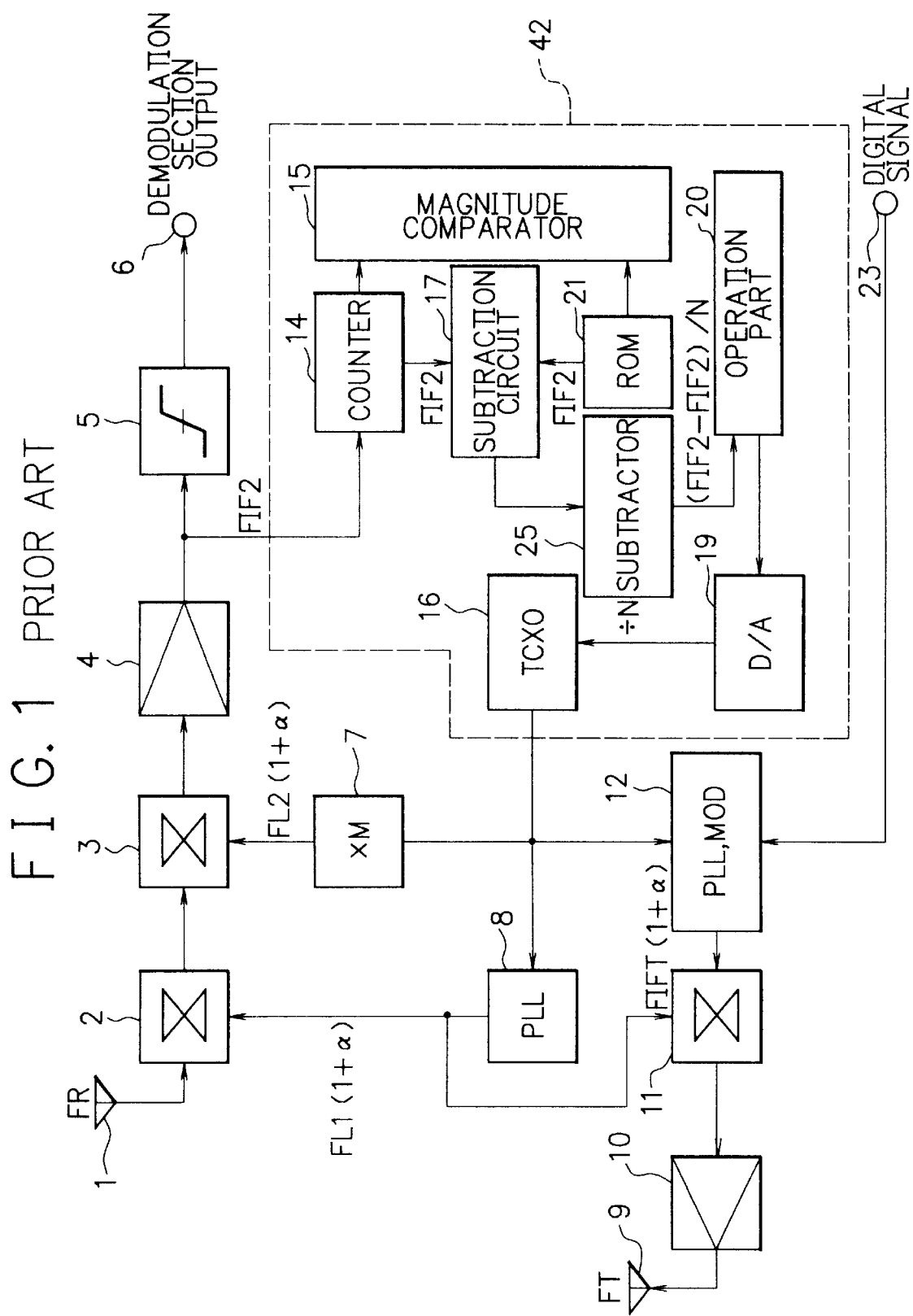
FIG. 1 is a block diagram showing a receiver of double superheterodyne system provided with an automatic frequency control circuit (AFC circuit) according to the conventional example.
Figure 2:
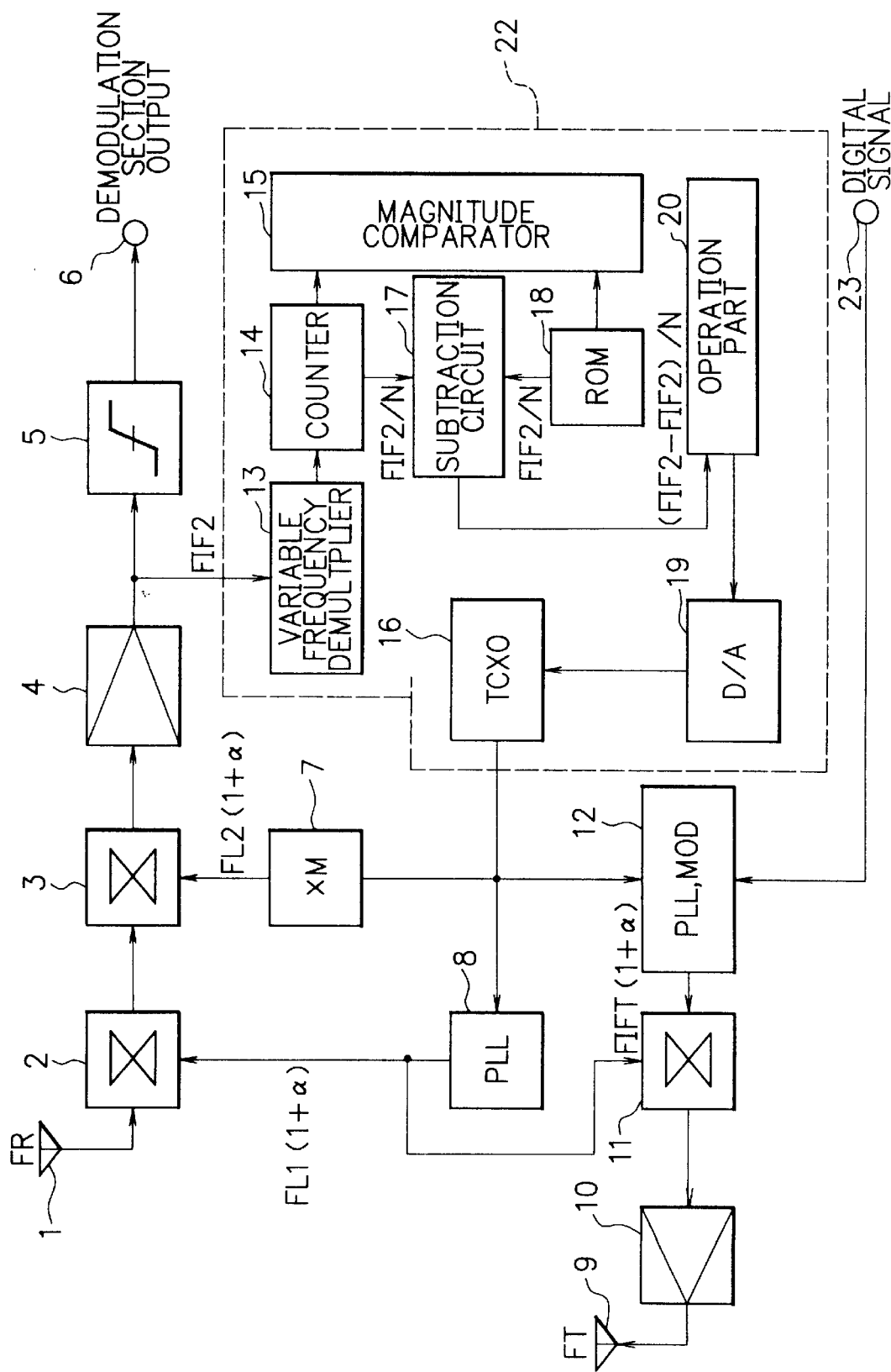
FIG. 2 is a block diagram showing a receiver of double superheterodyne system provided with an automatic frequency control circuit (AFC circuit) according to a first embodiment of an automatic frequency control circuit of the present invention.

An embodiment of an automatic frequency control circuit of the present invention will now be described in detail referring to the accompanying drawings. FIG. 2 shows one embodiment of the automatic frequency control circuit of the present invention.

The first embodiment of the present invention will be explained referring to the drawing.

In the embodiment, it causes an output frequency deviation of a temperature compensated crystal oscillator (TCXO) to compensate using a variable frequency demultiplier instead of a divider.

In FIG. 2, on the one hand, an output of an amplifier 4 is supplied to an output terminal 6 for a demodulation section, on the other hand, the output of the amplifier 4 is supplied to an automatic frequency control circuit (AFC circuit) 22 including constitution concerning characteristic of the invention. A phase-locked loop (PLL) synthesizer 12 with regard to a transmission system also has a function that it causes a signal to be incorporated from a digital signal input terminal 23 to be modulated. The characteristic of the invention is that there is provided the variable frequency demultiplier in front of a counter 14. The output of the amplifier 4 is capable of being dictated by the following expression (20) with reception frequency as FR, with the true intermediate frequency as FIF2, with the deviation factor as α, and with the intermediate frequency including deviation as fif2, which expression (20) is corresponding to the above described expression (5).

$$fif2 = \alpha(FIF2-FR) + FIF2 \qquad (20)$$

The variable frequency demultiplying circuit 13 divides the output of the amplifier into 1/N, thus counting frequency by the counter 14. Such N is capable of being dictated by the following expression (21), with a modulation sensitivity of the temperature compensated crystal oscillator as β [ppm/V], with output resolution of the digital-to-analog converter (D/A) as γ [V/bit], based on the relation of the modulation sensitivity of the temperature compensated crystal oscillator (TCXO) and the output resolution of the digital-to-analog (D/A) converter.

$$N = |-\gamma \cdot \beta(FIF2-FR)| \qquad (21)$$

Consequently, the output of the variable frequency demultiplier 13 comes to be following expression (22).

$$fif2/N = |\alpha(FIF2-FR)+FIF2|/|-\gamma \cdot \beta(FIF2-FR)| \qquad (22)$$

The output of the counter 14 is inputted to the magnitude comparator 15 to be compared with data obtained in such a way that it causes the true intermediate frequency of the ROM 18 to be divided by a factor of N. Then there is judged whether the frequency deviation of the intermediate frequency is higher frequency than the true intermediate frequency or lower frequency than the true intermediate frequency. Further, the output of the counter 14 is also inputted to a subtraction circuit 17, so that the data according to the following expression (23) is obtained.

$$|FIF2/N - fif2/N| = |FIF2/-\gamma \cdot \beta(FIF2-FR) - \qquad (23)$$
$$\{\alpha(FIF2-FR)+FIF2\}/-\gamma \cdot \beta(FIF2-FR)|$$
$$= |-\alpha(FIF2-FR)|/|-\gamma \cdot \beta(FIF2-FR)|$$

In the calculation section 20, the data to be outputted to the digital-to-analog converter (D/A) 19 is calculated in accordance with the result of output of the magnitude comparator 15 and the subtraction circuit 17. The digital-to-analog converter (D/A) 19 converts data from the calculation section 20 into the analog voltage to control the temperature compensated crystal oscillator (TCXO) 16, thus the oscillation frequency of the temperature compensated crystal oscillator (TCXO) 16 becomes stable oscillation frequency without deviation. As described above, according to the embodiment, it causes a frequency division ratio N of the variable frequency demultiplier to determine on the basis of the modulation sensitivity β [ppm/V] of the temperature compensated crystal oscillator (TCXO), the output resolution γ [V/bit] of the digital-to-analog converter (D/A), the reception frequency FR, and the true intermediate frequency FIF2. For this reason, it is capable of correcting the frequency deviation of the temperature compensated crystal oscillator (TCXO).

Next, a second embodiment of the invention will be explained referring to the accompanying drawing. In this embodiment, a register 26 is in use as a memory of the data which memory constitutes the automatic frequency control circuit (AFC circuit) 32.

Figure 3:
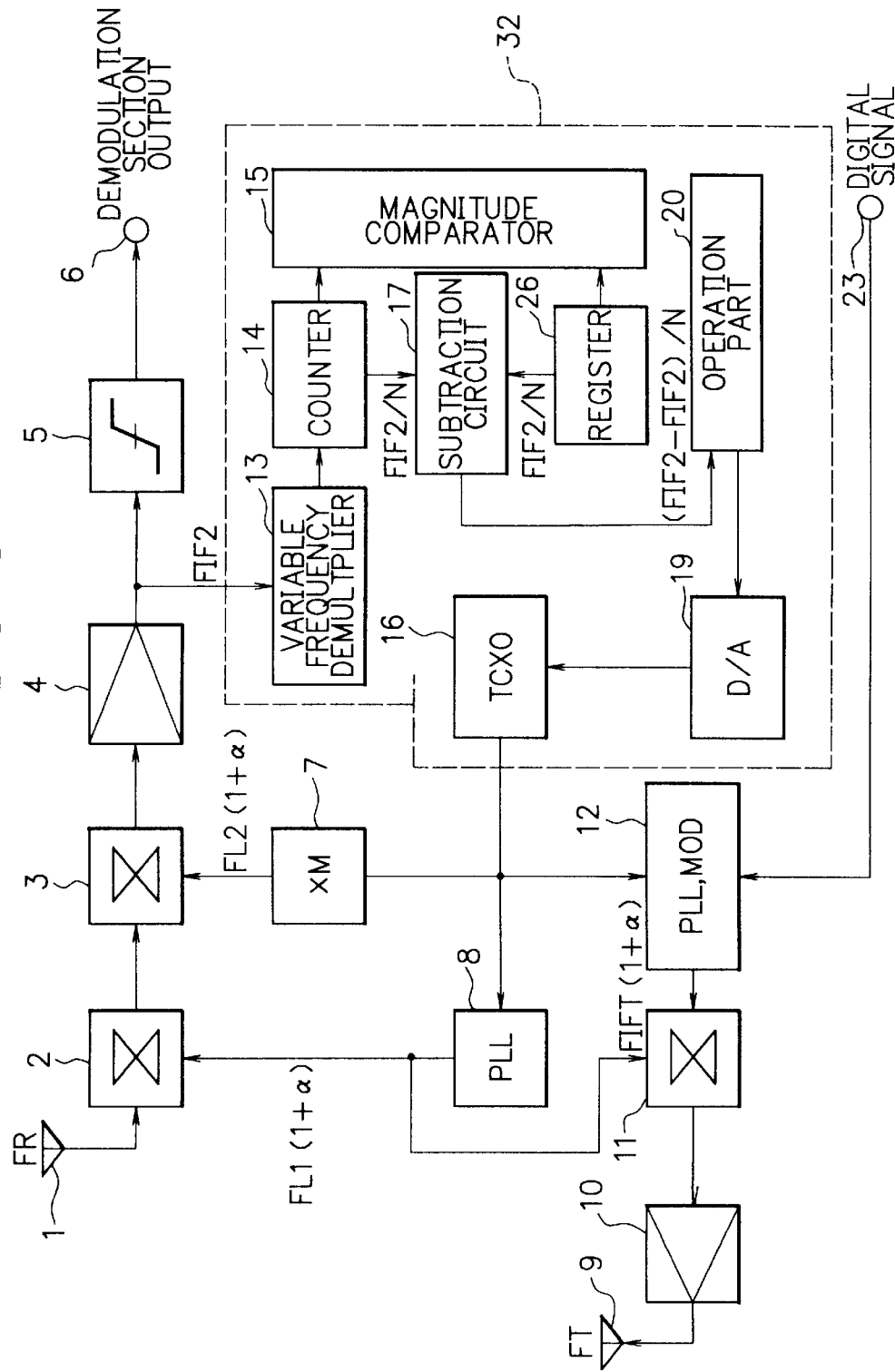
FIG. 3 is a block diagram showing a receiver of double superheterodyne system provided with an automatic frequency control circuit (AFC circuit) according to a second embodiment of the present invention.

FIG. 3 is a block diagram showing a receiver of double superheterodyne system provided with an automatic frequency control circuit (AFC circuit) according to the second embodiment of the present invention. In FIG. 3, The output of the counter 14 is inputted to the magnitude comparator 15 to be compared with data of the resister 26 supplied from the outside, then there is judged whether the frequency deviation of the intermediate frequency is higher frequency than the true intermediate frequency or the frequency deviation of the intermediate frequency is lower frequency than the true intermediate frequency.

Further, the output of the counter 14 is also inputted to the subtraction circuit 17 in which there is subtracted the data of the register 26 from the output of the counter 14. In the operation part 20, the data to be outputted to the digital-to-analog converter (D/A) 19 is calculated in accordance with the result of output of the magnitude comparator 15 and the subtraction circuit 17. The digital-to-analog converter (D/A) 19 converts data from the operation part 20 into the analog voltage to control the temperature compensated crystal oscillator (TCXO) 16, thus the oscillation frequency of the temperature compensated crystal oscillator (TCXO) 16 becomes stable oscillation frequency without deviation.

According to the above described embodiment, the relation between the deviation factor α, and the modulation sensitivity β of the temperature compensated crystal oscillator (TCXO) and the output resolution γ of the digital-to-analog converter (D/A) is capable of being dictated by α=γ·β [ppm/bit], with the modulation sensitivity of the temperature compensated crystal oscillator (TCXO) as β [ppm/V], and with the output resolution of the digital-to-analog converter (D/A) as γ [V/bit]. Further, the output of the amplifier 4 is capable of being dictated by the above described expression (20) with reception frequency as FR, with the true intermediate frequency as FIF2, with the deviation factor as α, and with the intermediate frequency including deviation as fif2.

Consequently, the frequency deviation of the intermediate frequency is dictated by the above described expression (6). As described above, when it causes α=γ·β to substitute for the above expression (6) to come to be the expression (7). When it causes these relations to integrate, following effect is obtained.

Frequency deviation of the intermediate frequency:

$|-\alpha(FIF2-FR)|[Hz]$

Rate of change of the intermediate frequency to the input of the digital-to-analog converter:

$|-\gamma \cdot \beta(FIF2-FR)|[Hz/bit]$

Consequently, (frequency deviation of intermediate frequency)/(rate of change of intermediate frequency to input of digital-to-analog converter (D/A)) comes to be an input data of the digital-to-analog converter (D/A) for eliminating the frequency deviation of the intermediate frequency.

As described above, it causes the frequency division ratio N of the frequency demultiplier to determine with the modulation sensitivity of the temperature compensated crystal oscillator as β [ppm/V], with the output resolution of the igital-to-analog converter as γ [V/bit], with the reception frequency as FR, and with the true intermediate frequency as FIF2. It is capable of compensating the frequency deviation of the temperature compensated crystal oscillator (TCXO) by supplying the data of the register from the outside. Consequently, it is capable of obtaining the same effect that divider is in use, although the divider is not in use. The number of gates to be used in this embodiment is decreased into 20% the number of gates for the conventional state, namely when the conventional divider (parallel division circuit) is in use as compared with in use of the variable frequency demultiplier of the present invention.

As described above, in the frequency automatic control circuit according to the present invention, it causes the frequency division ratio N of the variable frequency demultiplier to determine based upon the modulation sensitivity β [ppm/V] of the temperature compensated crystal oscillator (TCXO), the output resolution γ [V/bit] of the digital-to-analog converter (D/A), the reception frequency FR, and the true intermediate frequency FIF2. For this reason, it is capable of compensating the frequency deviation of the temperature compensated crystal oscillator (TCXO). It is capable of simplifying circuit constitution by using the variable frequency demultiplier as substitute for the divider.

While preferred embodiments of the invention have been described using specific terms, such description is for illustrative purpose only, and it is to be understood that changes and variations may be made without departing from the spirit or scope of the following claims.

What is claimed is:

1. An automatic frequency control circuit comprising:

a frequency counter for counting either number of an intermediate frequency or number of a regenerative intermediate frequency from a wave detection circuit which frequency counter follows a variable frequency demultiplier to be connected thereto;

a magnitude comparator for comparing an output of said frequency counter with a prescribed comparison data obtained in such a way that it causes a true intermediate frequency of a ROM to divide by a factor of N, and then there is judged whether a frequency deviation of said intermediate frequency is higher frequency than a true intermediate frequency or said frequency deviation of said intermediate frequency is lower frequency than said true intermediate frequency;

a subtraction circuit for subtracting said output of said frequency counter from said prescribed comparison data;

an operation part for implementing prescribed operation according both to an output of said magnitude comparator and an output of said subtraction circuit such that the data to be outputted to a D/A converter is calculated in accordance with the result of output of the magnitude comparator and the subtraction circuit;

a D/A (digital-to-analog) converter for converting an output of said operation part into an analog signal;

a TCXO (temperature compensated crystal oscillator) for oscillating an oscillation frequency according to said analog signal of said D/A converter; and a variable frequency demultiplier connected to a stage in front of said frequency counter for dividing an output of an amplifier by a factor of N to output to said frequency counter, wherein said D/A converter converts data from said operation part into an analog voltage to control said TCXO, causing an oscillation frequency of said TCXO to be stable oscillation frequency without deviation.

2. An automatic frequency control circuit as claimed in claim 1, wherein a number of frequency division of said variable frequency demultiplier and said prescribed comparison data are selected according to modulation sensitivity of said TCXO, output resolution of said D/A converter, reception frequency, and a true intermediate frequency.

3. An automatic frequency control circuit as claimed in claim 2, wherein said prescribed comparison data is stored in a storage unit such as a ROM, a register circuit and so forth.

4. An automatic frequency control circuit as claimed in claim 3, wherein said storage unit is temporary storage type and is capable of rewriting, thus it is capable of changing said prescribed comparison data at any time.

5. An automatic frequency control circuit as claimed in claim 4, wherein said selected number of frequency division of said variable frequency demultiplier and said comparison data are provided by said storage unit.

6. A frequency deviation eliminating method of an automatic frequency control circuit comprising the steps of:

a frequency counting step for counting either number of an intermediate frequency or number of a regenerative intermediate frequency from a wave detection circuit;

a magnitude comparison step for comparing an output of said frequency counter with a prescribed comparison data obtained in such a way that it causes a true intermediate frequency of a ROM to divide by a factor of N, and then being judged whether a frequency deviation of said intermediate frequency is higher frequency than a true intermediate frequency or said frequency deviation of said intermediate frequency is lower frequency than said true intermediate frequency;

a subtraction step for subtracting said output of said frequency counter from said prescribed comparison data;

an operation step for implementing prescribed operation according both to an output of said magnitude comparison step and an output of said subtraction step such that the data to be outputted to a D/A converter is calculated in accordance with a result of output of said magnitude comparison step and said subtraction step;

a D/A (digital-to-analog) converting step for converting an output of said operation step into an analog signal;

an oscillating step (by a temperature compensated crystal oscillator) for oscillating an oscillation frequency according to said analog signal of said D/A converting stop; and a variable frequency demultiplying step for dividing an output of an amplifier by a factor of N before said frequency counting step, wherein said D/A converting step converts data from said operating step into an analog voltage to control said oscillating step, causing an oscillation frequency from said oscillating step to be stable oscillation frequency.

* * * * *